(12) United States Patent
Yamamoto

(10) Patent No.: US 10,340,169 B2
(45) Date of Patent: Jul. 2, 2019

(54) ANTIREFLECTION MEMBER AND ORIENTER APPARATUS HAVING A THIRD PLATE PART WITH A SECOND NOTCH PART AND AN ANTIREFLECTION SURFACE

(71) Applicant: Toshiba Memory Corporation, Minato-ku (JP)

(72) Inventor: Katsutoshi Yamamoto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 813 days.

(21) Appl. No.: 15/041,188

(22) Filed: Feb. 11, 2016

(65) Prior Publication Data

US 2017/0117173 A1    Apr. 27, 2017

(30) Foreign Application Priority Data

Oct. 21, 2015    (JP) .................................. 2015-207445

(51) Int. Cl.
| | |
|---|---|
| *H01L 21/68* | (2006.01) |
| *G01B 11/14* | (2006.01) |
| *G01J 1/04* | (2006.01) |
| *G02B 1/11* | (2015.01) |
| *G02B 1/10* | (2015.01) |
| *G02B 5/22* | (2006.01) |

(52) U.S. Cl.
CPC ............ *H01L 21/681* (2013.01); *G01B 11/14* (2013.01); *G01J 1/0407* (2013.01); *G02B 1/10* (2013.01); *G02B 1/11* (2013.01); *G02B 5/22* (2013.01)

(58) Field of Classification Search
CPC . H01L 21/682; H01L 21/6838; H01L 21/268; G02B 1/11; G02B 5/22; G01B 11/028; G01N 21/9505
USPC ........................................................ 250/221
See application file for complete search history.

(56) References Cited

U.S. PATENT DOCUMENTS

| | | | |
|---|---|---|---|
| 7,109,511 B2 | 9/2006 | Inenaga et al. | |
| 7,315,373 B2 * | 1/2008 | Fukuzaki | ................ H01L 21/68 356/399 |
| 8,153,995 B2 | 4/2012 | Hino | |

(Continued)

FOREIGN PATENT DOCUMENTS

| | | |
|---|---|---|
| JP | 2-116125 A | 4/1990 |
| JP | 2000-68357 | 3/2000 |
| JP | 2002-141396 | 5/2002 |

(Continued)

*Primary Examiner* — Que Tan Le
(74) *Attorney, Agent, or Firm* — Oblon, McClelland, Maier & Neustadt, L.L.P.

(57) ABSTRACT

According to one embodiment, there is provided an antireflection member including a first plate part, a second plate part, and a third plate part. The first plate part has a first end and a second end. The second end is arranged at a side opposite to the first end. The second plate part extends from a vicinity of the first end. A first notch part is arranged on the second plate part. The second plate part has an antireflection surface. The third plate part extends from a vicinity of the second end to be opposed to the second plate part A second notch part is arranged at a position corresponding to the first notch part on the third plate part. The third plate part has an antireflection surface directed to the antireflection surface of the second plate part.

20 Claims, 13 Drawing Sheets

(56) References Cited

U.S. PATENT DOCUMENTS

2013/0330848 A1  12/2013  Minato et al.

FOREIGN PATENT DOCUMENTS

| JP | 2010-92619 | 4/2010 |
| JP | 2014-175527 | 9/2014 |
| WO | WO 2012/115012 A1 | 8/2012 |
| WO | WO 2014/149340 A1 | 9/2014 |

* cited by examiner

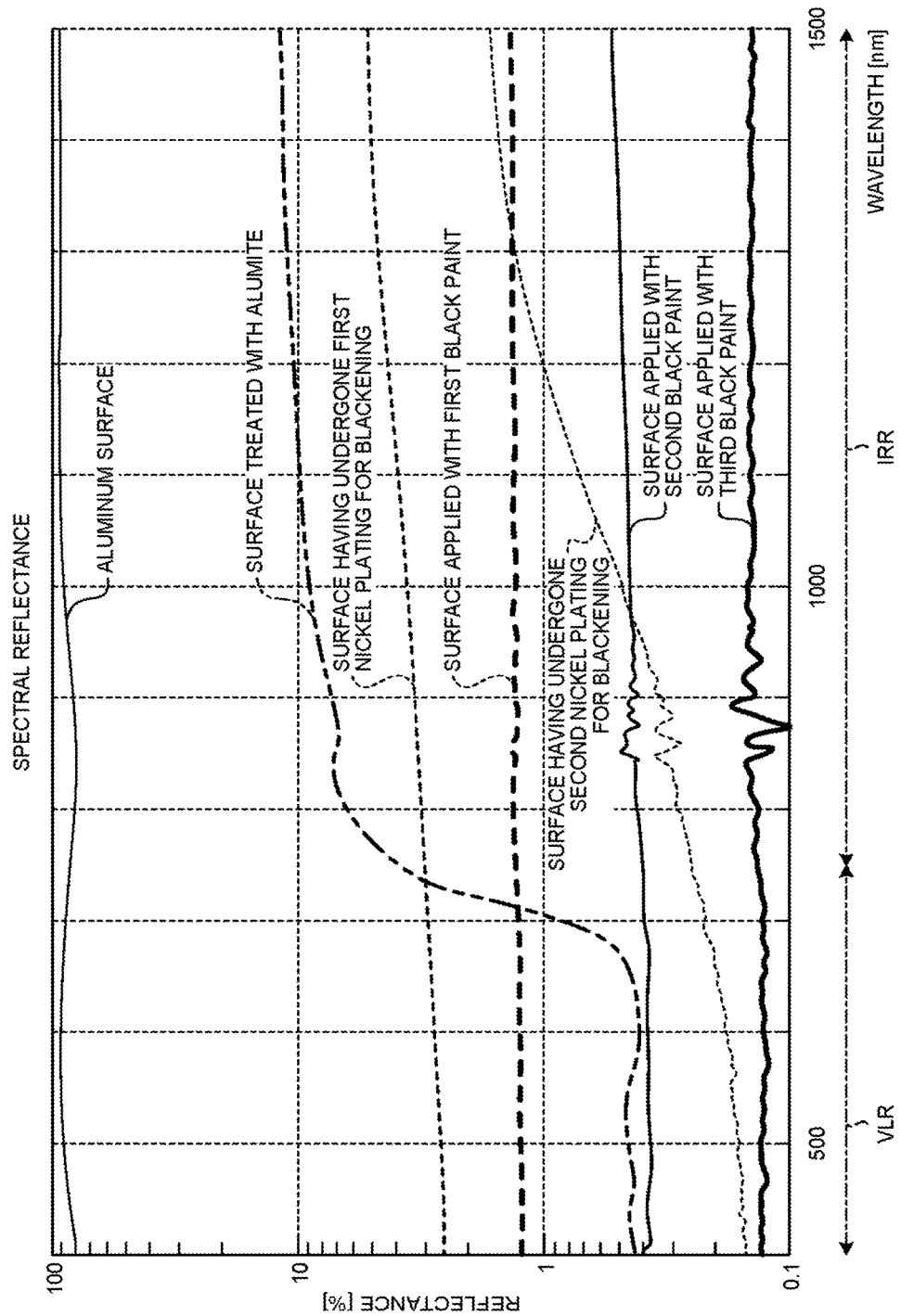

FIG.12
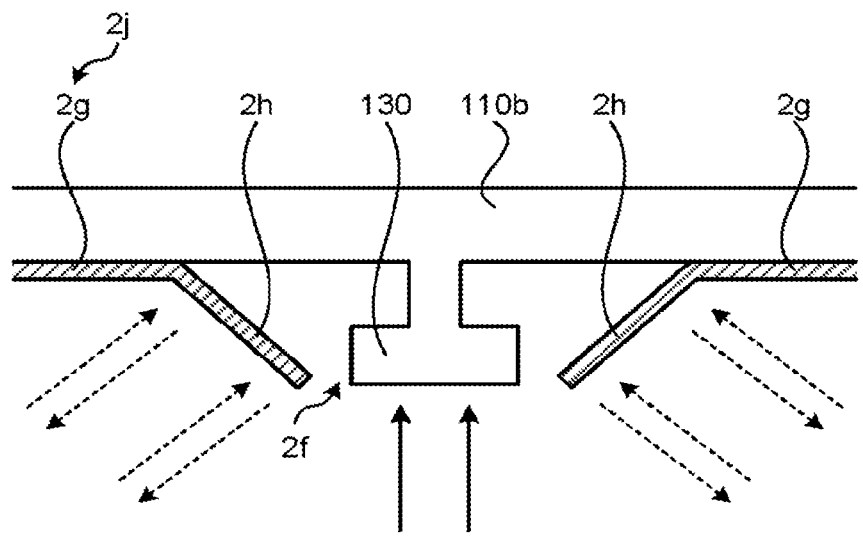
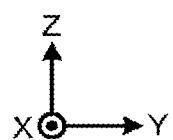
FIG.13
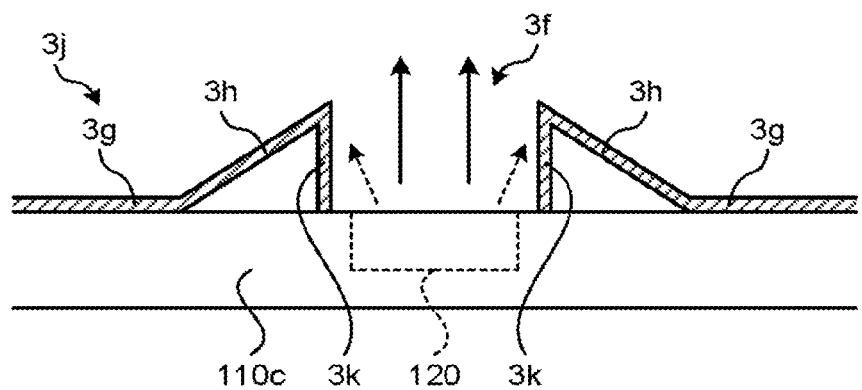
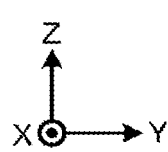

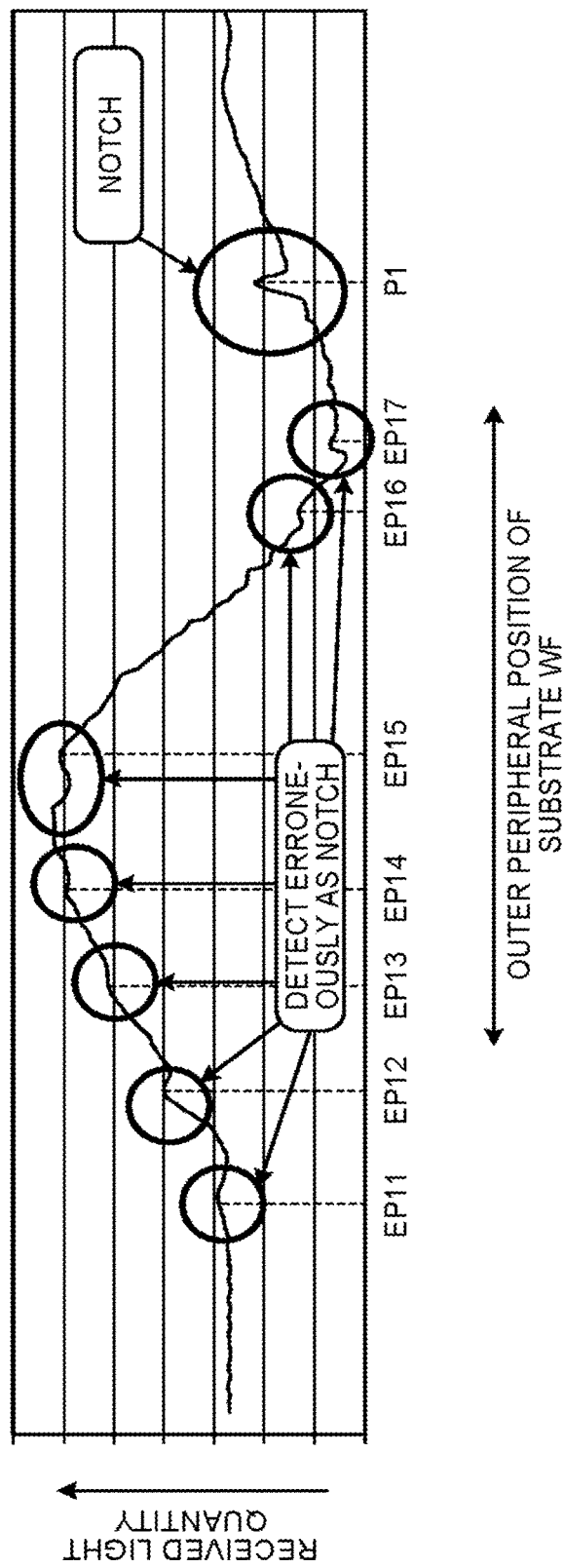

ANTIREFLECTION MEMBER AND ORIENTER APPARATUS HAVING A THIRD PLATE PART WITH A SECOND NOTCH PART AND AN ANTIREFLECTION SURFACE

CROSS-REFERENCE TO RELATED APPLICATIONS

This application is based upon and claims the benefit of priority from Japanese Patent Application No. 2015-207445, filed on Oct. 21, 2015; the entire contents of which are incorporated herein by reference.

FIELD

Embodiments described herein relate generally to an antireflection member and an orienter apparatus.

BACKGROUND

To adjust the orientation of a substrate, an orienter apparatus irradiates an outer peripheral part of the substrate with light emitted by a light-emitting element while rotating the substrate and obtains the outer peripheral position of a notch of the substrate based on a quantity of light received by a light-receiving element. At this time, the light emitted by the light-emitting element is desired to be appropriately received by the light-receiving element.

BRIEF DESCRIPTION OF THE DRAWINGS

FIG. 7 is a diagram illustrating spectral reflection characteristics of materials according to the embodiment;

FIG. 12 is a front view illustrating a function of the antireflection member according to the another modification of the embodiment;

FIG. 13 is a front view illustrating the function of the antireflection member according to the another modification of the embodiment; and FIG. 14 is a waveform chart illustrating an operation of an orienter apparatus not including an antireflection member.

DETAILED DESCRIPTION

In general, according to one embodiment, there is provided an antireflection member including a first plate part, a second plate part, and a third plate part. The first plate part has a first end and a second end. The second end is arranged at a side opposite to the first end. The second plate part extends from a vicinity of the first end. A first notch part is arranged on the second plate part. The second plate part has an antireflection surface. The third plate part extends from a vicinity of the second end to be opposed to the second plate part. A second notch part is arranged at a position corresponding to the first notch part on the third plate part. The third plate part has an antireflection surface directed to the antireflection surface of the second plate part.

Exemplary embodiments of an antireflection member will be explained below in detail with reference to the accompanying drawings. The present invention is not limited to the following embodiments.

EMBODIMENT

An orienter apparatus including an antireflection member according to an embodiment is described. In a process of manufacturing a device (for example, a semiconductor device) by processing a substrate (for example, a semiconductor substrate), the orientation of the substrate to be processed is required to be appropriate in some cases. An orienter apparatus that adjusts the orientation of the substrate may be applied to an apparatus for processing substrates in response to the above requirement.

Figure 1:
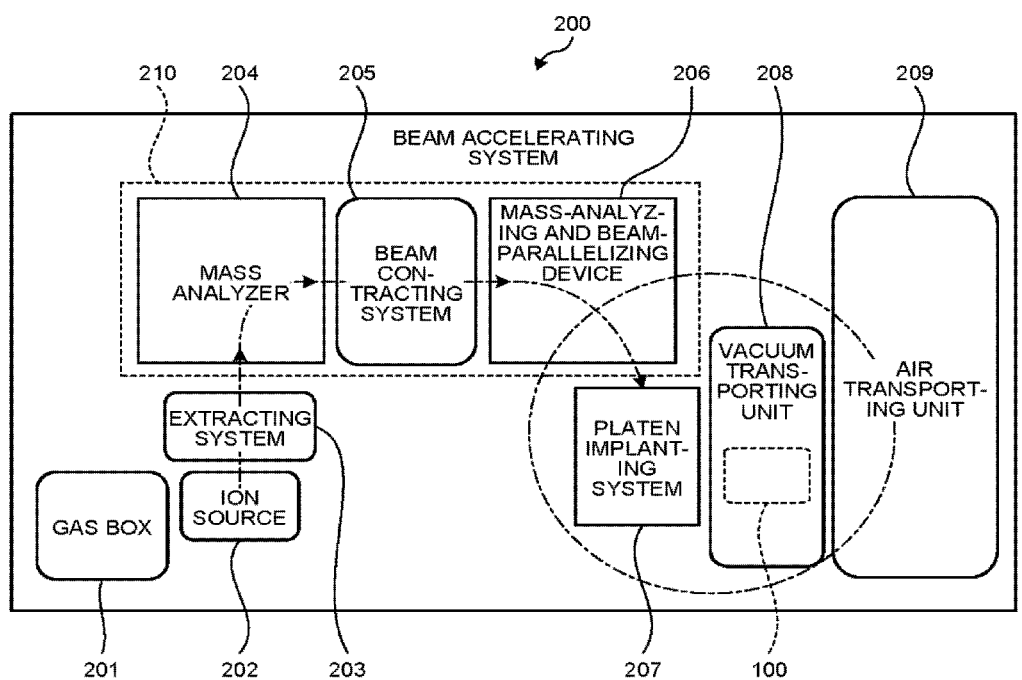
FIG. 1 is a plan view illustrating a configuration of an ion implanting apparatus to which an orienter apparatus including an antireflection member according to an embodiment is applied.

For example, an orienter apparatus 100 is applied to an ion implanting apparatus 200 illustrated in FIG. 1. FIG. 1 is a plan view illustrating a configuration of the ion implanting apparatus 200. A substrate is imported to a platen implanting system 207 via an air transporting unit 209 and a vacuum transporting unit 208. The orienter apparatus 100 is included in the vacuum transporting unit 208.

Figure 2:
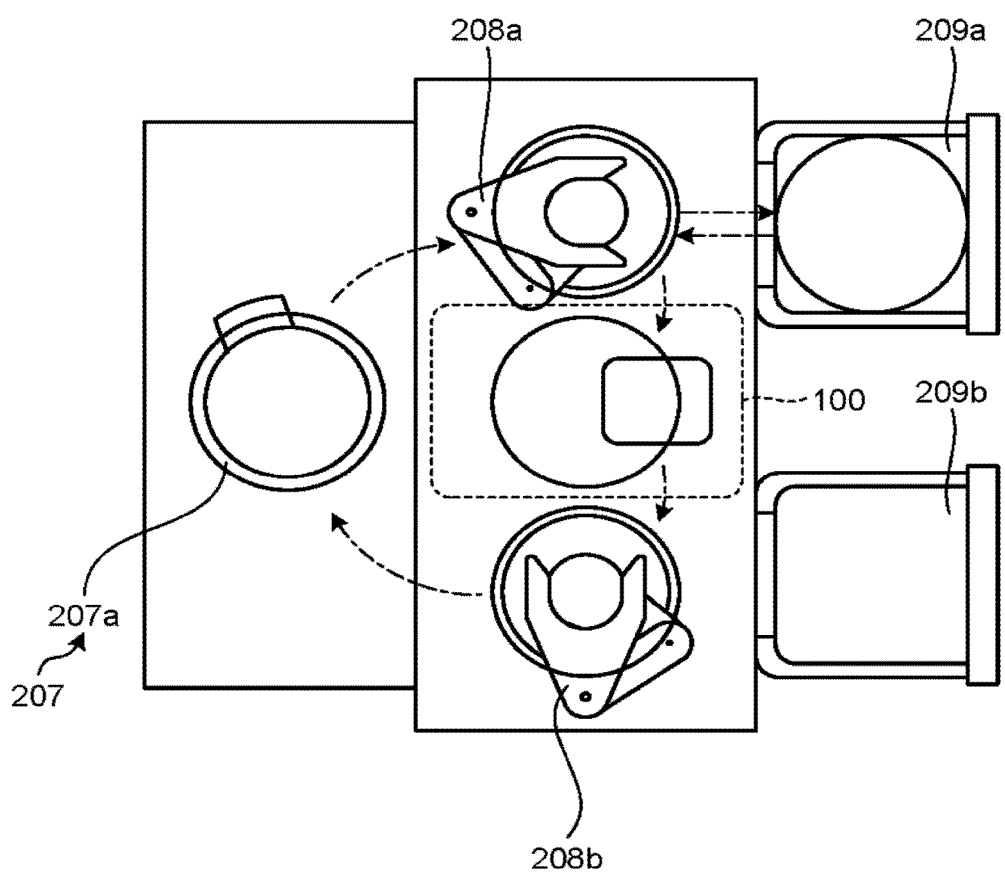
FIG. 2 is a plan view illustrating a configuration of a vacuum transporting unit having the orienter apparatus including the antireflection member according to the embodiment arranged therein.

As illustrated in FIG. 2, a transporting apparatus imports a substrate into either a load lock chamber 209a or 209b in the air transporting unit 209. FIG. 2 is a plan view illustrating a configuration of the vacuum transporting unit 208 having the orienter apparatus 100 arranged therein and an enlarged plan view of an area surrounded by the one-dot chain line in FIG. 1. For example, when a substrate is imported into the load rock chamber 209a, the load rock chamber 209a is evacuated and is made to communicate with the vacuum transporting unit 208. As indicated by the one-dot chain line arrow, an arm 208a in the vacuum transporting unit 208 imports the substrate from the load lock chamber 209a into the orienter apparatus 100. The orienter apparatus 100 adjusts the orientation of the imported substrate. As indicated by the one-dot chain line arrow, an arm 208b in the vacuum transporting unit 208 imports the substrate the orientation of which has been adjusted from the orienter apparatus 100 onto a stage 207a of the platen implanting system 207.

Referring back to FIG. 1, an ion source 202 generates plasma from material gas from a gas box 201 to generate ions. An extracting system 203 includes an extracting electrode, extracts the ions from the ion source 202 with the extracting electrode and causes the ions to enter a beam accelerating system 210. The beam accelerating system 210 includes a mass analyzer 204, a beam contracting system 205, and a mass-analyzing and beam-parallelizing device 206. The mass analyzer 204 passes ions having a predetermined mass among the incident ions selectively to the beam contracting system 205. The beam contracting system 205 accelerates the ions and contracts the ion beams to guide the ion beams to the mass-analyzing and beam-parallelizing device 206. The mass-analyzing and beam-parallelizing device 206 selects ions having a predetermined mass from among the guided ions. Also, the mass-analyzing and beam-parallelizing device 206 adjusts and parallelizes the ion beams and guides the parallelized beams to the platen implanting system 207. The ions having been guided to the platen implanting system 207 are implanted to a substrate.

After ion implantation is completed, the arm 208a in the vacuum transporting unit 208 exports the substrate from the stage 207a of the platen implanting system 207 into the load rock chamber 209a as indicated by the one-dot chain line arrow in FIG. 2, for example. Thereafter, the load rock chamber 209a is released to the air and the substrate is exported to outside of the ion implanting apparatus 200 by the transporting apparatus.

Figure 3A:
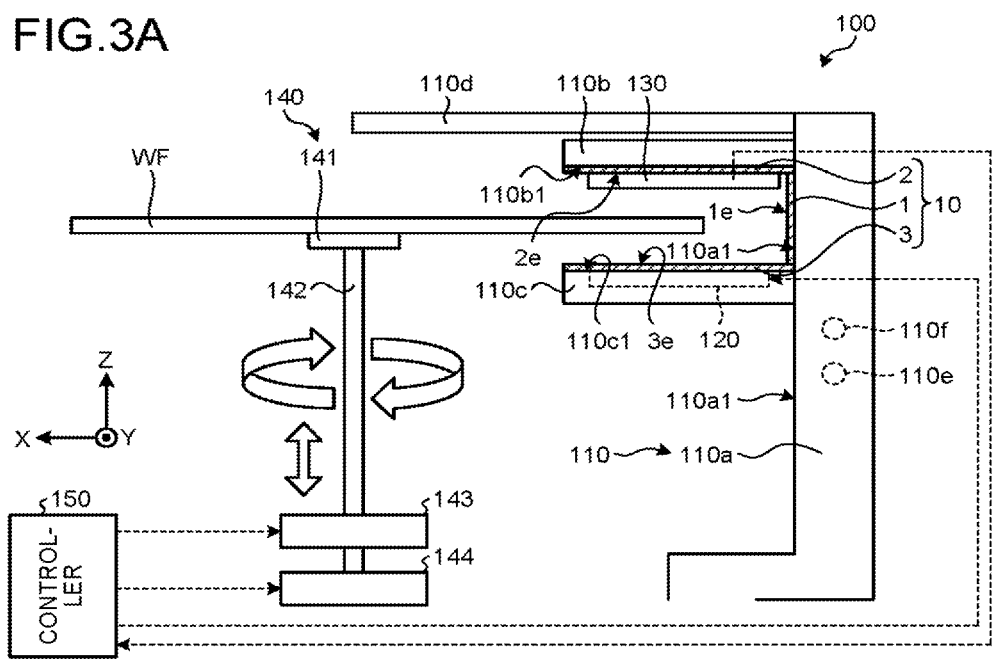
FIGS. 3A and 3B are a side view and a plan view illustrating a configuration of the orienter apparatus including the antireflection member according to the embodiment.
Figure 3B:
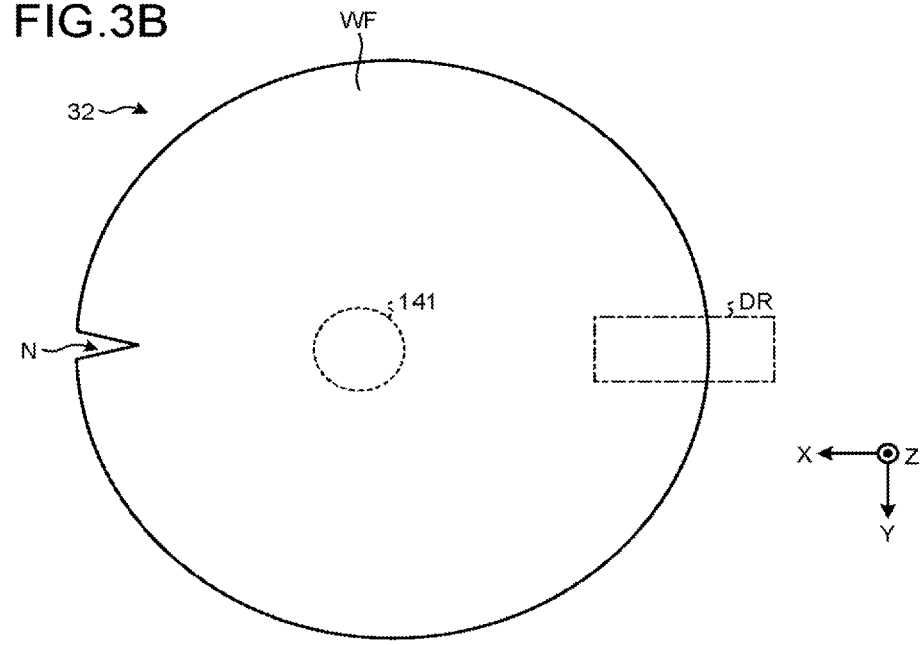

In the ion implanting apparatus 200, the platen implanting system 207 implants ions to a substrate after the orienter apparatus 100 adjusts the orientation of the substrate. Accordingly, the ions can be implanted at an appropriate angle relative to the crystal orientation of the substrate. For example, as illustrated in FIG. 3A, the orienter apparatus 100 includes an apparatus body 110, a light-emitting element 120, a light-receiving element 130, a supporting mechanism 140, and a controller 150. FIGS. 3A and 3B illustrate a configuration of the orienter apparatus 100 including an antireflection member 10. FIG. 3A is a side view of the orienter apparatus 100. FIG. 3B is a plan view illustrating a part of the orienter apparatus 100. In FIG. 3A, a Z direction represents a direction that is substantially perpendicular to the surface of a substrate WF when the substrate WF is placed in the orienter apparatus 100 and X and Y directions respectively represent two directions that are orthogonal to each other in a plane substantially perpendicular to the Z direction.

The apparatus body 110 includes parts 110a, 110b, 110c, and 110d. The part 110a (first part) extends in the Z direction in a plate shape (see FIGS. 6A and 6B). A principal surface 110a1 of the part 110a is along the YZ plane. The part 110b (second part) extends in the +X direction in a plate shape from the vicinity (first region) of the +Z-side end of the part 110a. A lower surface 110b1 of the part 110b is along the XY plane and extends in a direction substantially perpendicular to the principal surface 110a1 of the part 110a. The part 110c (third part) extends in a substantially horizontal direction in a plate shape from a position (second region) between the upper and lower ends of the part 110a. An upper surface 110c1 of the part 110c is along the XY plane and extends in a direction substantially perpendicular to the principal surface 110a1 of the part 110a. The part 110c extends so as to be opposed to the part 110b. The parts 110a, 110b, and 110c form a substantially F-shape as viewed from the −Y direction. The part 110d is provided as a top plate above the substantially F-shape formed of the parts 110a, 110b, and 110c. In the apparatus body 110, the part 110b is formed of a material composed of plastic as a main component, for example, and the parts 110a and 110c are formed of a material composed of metal such as aluminum, as a main component, for example. Accordingly, the surfaces of all of the parts 110a to 110c easily reflect light.

The light-emitting element 120 is fixed at a position opposed to the light-receiving element 130 in the apparatus body 110. The light-emitting element 120 is arranged on the upper surface 110c1 of the part 110c. For example, the light-emitting element 120 is embedded in the part 110c in such a way that the height of the upper surface of the light-emitting element 120 is substantially equal to the height of the upper surface 110c1 of the part 110c (see FIG. 6). Accordingly, light emitted by the light-emitting element 120 can advance along the +Z direction. For example, the light-emitting element 120 includes a lamp or an LED (Light Emitting Diode). The light emitted by the light-emitting element 120 may be infrared light or may be visible light. Turing on and off of the light-emitting element 120 may be controlled by the controller 150.

The light-receiving element 130 is fixed at a position opposed to the light-emitting element 120 in the apparatus body 110. The light-receiving element 130 is arranged on the lower surface 110b1 of the part 110b. For example, the light-receiving element 130 projects from the part 110b in such a way that the lower surface of the light-receiving element 130 is located lower than the lower surface 110b1 of the part 110b. For example, the light-receiving element 130 includes an optical sensor. The light-receiving element 130 can receive light (for example, infrared light or visible light) that has been generated by the light-emitting element 120 and has advanced along the +Z direction and detect the intensity of the light because the light-receiving element 130 is opposed to the light-emitting element 120. The light-receiving element 130 supplies the detected light intensity to the controller 150.

The supporting mechanism 140 supports the substrate WF rotatably while the end of the substrate WF is positioned between the light-emitting element 120 and the light-receiving element 130. The supporting mechanism 140 includes a pad 141, a shaft 142, a rotating mechanism 143, and a lifting mechanism 144. The substrate WF is placed on the pad 141.

For example, as illustrated in FIG. 3B, the supporting mechanism 140 supports the substrate WF in such a way that the substantial center of the substrate WF contacts with the upper side of the pad 141. At this time, as illustrated in FIG. 3B, the end of the substrate WF may be positioned in a region DR in which the light-emitting element 120 and the light-receiving element 130 overlap with each other as viewed through from the +Z direction.

The shaft 142 connects the pad 141 and the rotating mechanism 143 and the lifting mechanism 144 mechanically. The rotating mechanism 143 rotates the substrate WF around the axis in the Z direction via the shaft 142 and the pad 141 under the control of the controller 150. The lifting mechanism 144 moves the substrate WF vertically in the Z direction via the shaft 142 and the pad 141 under the control of the controller 150.

The controller 150 obtains the outer peripheral position of a notch N of the substrate WF based on a quantity of light emitted by the light-emitting element 120 and received by the light-receiving element 130 while the supporting mechanism 140 is rotating the substrate WF. That is, as illustrated in FIG. 3B, the region DR in which the light-emitting element 120 and the light-receiving element 130 overlaps with each other as viewed through from the +Z direction forms a region for detecting the outer peripheral position of the notch N of the substrate WF. For example, when the received light quantity by the light-receiving element 130 abruptly changes (increases or decreases) during the rotation of the substrate WF, the controller 150 can specify an outer peripheral position at which the abrupt change occurs as the outer peripheral position of the notch N.

For example, as illustrated in FIG. 14, when the received light quantity abruptly changes at a plurality of positions P1, EP11 to EP17 in the outer peripheral position in one rotation of the substrate WF, specifying the outer peripheral position of the notch N is difficult for the controller 150. That is, the controller 150 may detect not only the appropriate position P1 of the notch N as the outer peripheral position of the notch N but also the positions EP1 to EP17 erroneously as the outer peripheral position of the notch N. In this way, the notch N is detected at the plurality of positions P1, EP11 to EP17. Accordingly, a notch detection error is likely to occur.

This error is likely to occur in the latter half of an ion implanting process among all processes for processing the substrate WF, and thus it has been found that the error is an error caused by the substrate WF. When a factor of the error is examined in more detail, it has been found that erroneous detection occurs because not a stain or the like on the end of the substrate WF but the pattern or the oxide film on the front and rear surfaces of the substrate WF causes irregular reflection of light (for example, infrared light) and the light-receiving element 130 receives the irregularly reflected light.

Therefore, in the present embodiment, the antireflection member 10 is arranged in a region including the vicinity of the light-emitting element 120 and the vicinity of the light-receiving element 130 in the apparatus body 110. Accordingly, while cost of the orienter apparatus 100 can be suppressed, irregular reflection of light emitted by the light-emitting element 120 can be suppressed from having influence on the substrate WF.

Figure 4:
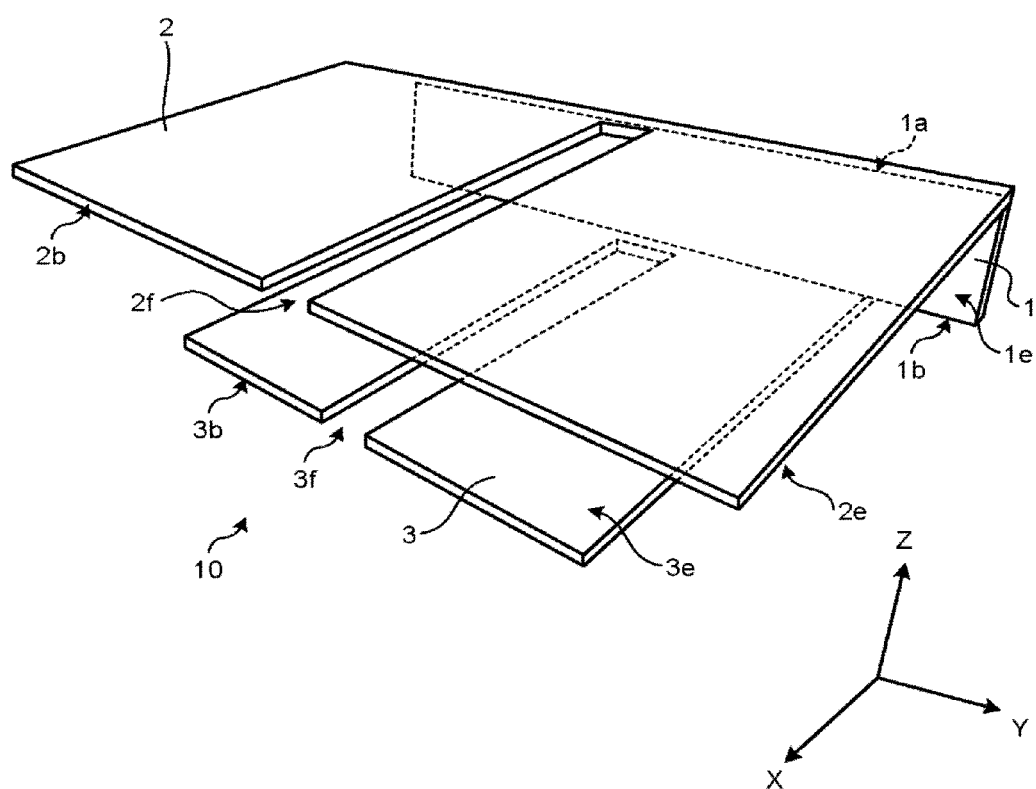
FIG. 4 is a perspective view illustrating a configuration of the antireflection member according to the embodiment.
Figure 5A:
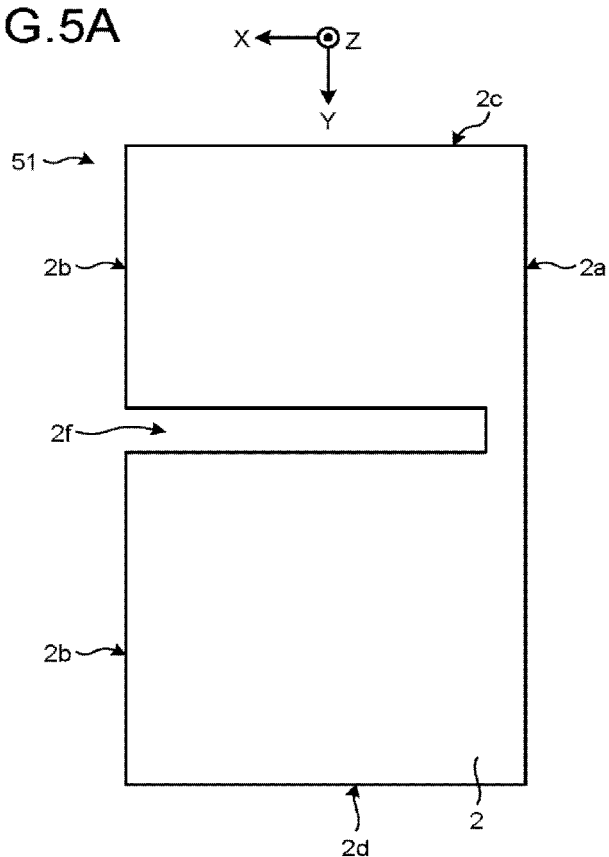
FIGS. 5A, 5B, and 5C are exploded plan views illustrating the configuration of the antireflection member according to the embodiment.
Figure 5B:
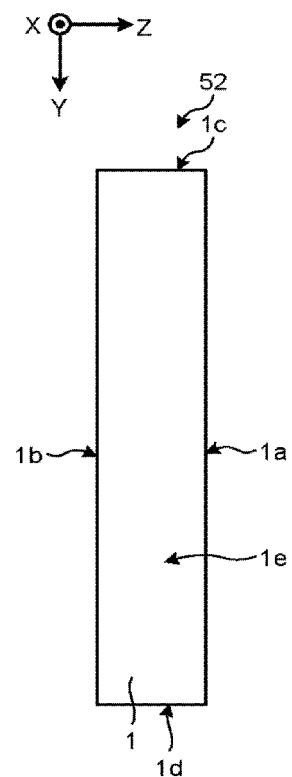
Figure 5C:
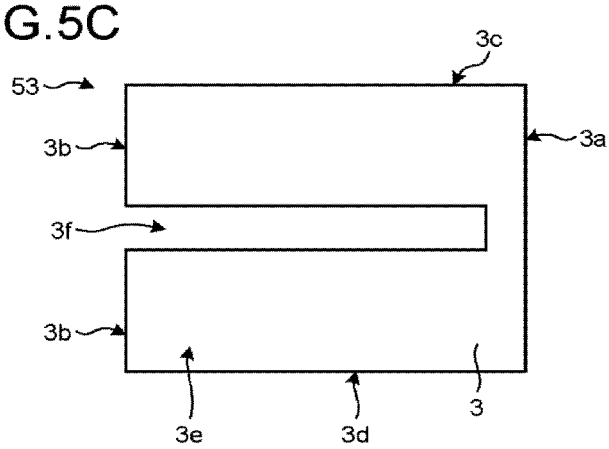

Specifically, the antireflection member 10 to be arranged in the apparatus body 110 is configured as illustrated in FIGS. 4 and 5A-5C. FIG. 4 is a perspective view illustrating a configuration of the antireflection member 10. FIGS. 5A, 5B, and 5C are exploded plan views illustrating the configuration of the antireflection member. In FIGS. 4 and 5A-5C, the X, Y, and Z directions are illustrated so as to match directions when the antireflection member 10 is arranged in the apparatus body 110.

The antireflection member 10 includes a plate part (first plate part) 1, a plate part (second plate part) 2, and a plate part (third plate part) 3. The plate part 1 is arranged so as to be upright along the Z direction and extends in the Y direction in a plate shape. As illustrated in FIG. 5B, the plate part 1 includes ends 1a, 1b, 1c, and 1d and an antireflection surface 1e. The ends 1a, 1b, 1c, and 1d are ends at the +Z side, the −Z side, the −Y side, and the +Y side of the plate part 1, respectively. The antireflection surface 1e is along the YZ plane. The antireflection surface 1e is a principal surface including an antireflection function of the plate part 1. The antireflection surface 1e is a principal surface directed to the +X direction and directed to the plate parts 2 and 3 (see FIG. 3A).

Figure 6A:
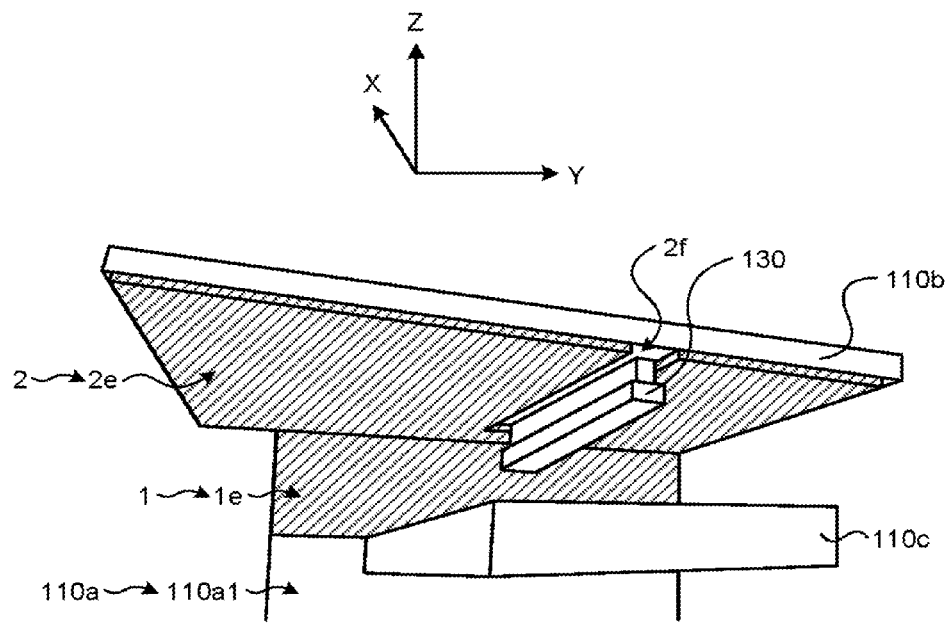
FIGS. 6A and 6B are perspective views illustrating a mounted state of the antireflection member according to the embodiment to an apparatus body.
Figure 6B:
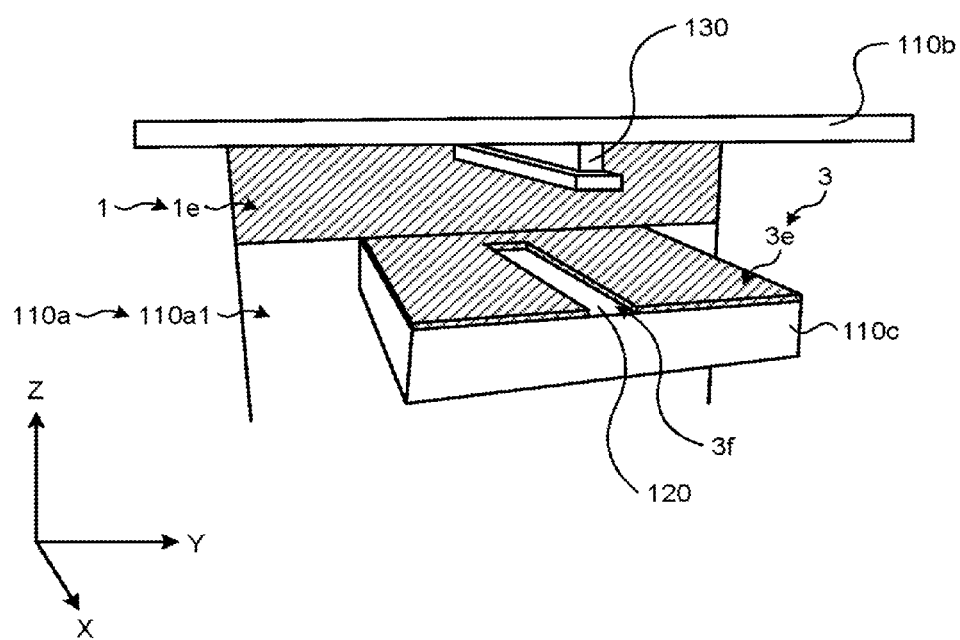

As illustrated in FIGS. 6A and 6B, the plate part 1 is arranged in a region (that is, a third region between the first region and the second region) in the principle surface 110a1 (see FIG. 3A) of the part 110a between the part 110b and the part 110c in the apparatus body 110. FIGS. 6A and 6B are perspective views illustrating a mounted state of the antireflection member 10 to the apparatus body 110. For example, the plate part 1 may be fixed in the region in the principle surface 110a1 between the part 110b and the part 110c with an adhesive or the like. That is, the plate part 1 functions as a shielding plate for shielding re-reflection of light that has been generated by the light-emitting element 120 and irregularly reflected by the front or rear surface of the substrate WF.

As illustrated in FIGS. 4 and 5, the plate part 2 extends from the vicinity of the end 1a of the plate part 1 in the +X direction in a plate shape. As illustrated in FIG. 5A, the plate part 2 includes ends 2a, 2b, 2c, and 2d, an antireflection surface 2e (see FIG. 6A), and a notch part (first notch part) 2f. The ends 2a, 2b, 2c, and 2d are ends at the −X side, the +X side, the −Y side, and the +Y side of the plate part 2, respectively. The end 2b is an end of the plate part 2 opposed to the plate part 1. The antireflection surface 2e is along the XY plane. The antireflection surface 2e is a principal surface including an antireflection function of the plate part 2. The antireflection surface 2e is a principal surface directed to the −Z direction and directed to an antireflection surface 3e of the plate part 3 (see FIG. 3A). The notch part 2f extends from the end 2b so as to approach the plate part 1.

As illustrated in FIG. 6A, the plate part 2 is arranged in the vicinity of the light-receiving element 130 in the apparatus body 110. The plate part 2 is arranged on the lower surface 110b1 (see FIG. 3A) of the part 110b. For example, the plate part 2 may be fixed to the lower surface 110b1 of the part 110b with an adhesive or the like. The notch part 2f is formed at a position corresponding to the light-receiving element 130 on the plate part 2. The notch part 2f has a shape (a shape extending in the X direction) corresponding to the light-receiving element 130. That is, the plate part 2 functions as a shielding plate for shielding re-reflection of light that has been generated by the light-emitting element 120 and irregularly reflected by the front or rear surface of the substrate WF.

As illustrated in FIGS. 4 and 5, the plate part 3 extends from the vicinity of the end 1b of the plate part 1 in the +X direction in a plate shape. As illustrated in FIG. 5C, the plate part 3 includes ends 3a, 3b, 3c, and 3d, the antireflection surface 3e, and a notch part (second notch part) 3f. The ends 3a, 3b, 3c, and 3d are ends at the −X side, the +X side, the −Y side, and the +Y side of the plate part 3, respectively. The end 3b is an end of the plate part 3 opposed to the plate part 1. The antireflection surface 3e is along the XY plane. The antireflection surface 3e is a principal surface including an antireflection function of the plate part 3. The antireflection surface 3e is a principal surface directed to the +Z direction and directed to the antireflection surface 2e of the plate part 2 (see FIG. 3A). The notch part 3f extends from the end 3b so as to approach the plate part 1.

As illustrated in FIG. 6B, the plate part 3 is arranged in the vicinity of the light-emitting element 120 in the apparatus body 110. The plate part 3 is arranged on the upper surface 110c1 (see FIG. 3A) of the part 110c. For example, the plate part 3 may be fixed to the upper surface 110c1 of the part 110c with an adhesive or the like. The notch part 3f is formed at a position corresponding to the light-emitting element 120 on the plate part 3. The notch part 3f has a shape (a shape extending in the X direction) corresponding to the light-emitting element 120. That is, the plate part 3 functions as a shielding plate for shielding re-reflection of light that has been generated by the light-emitting element 120 and irregularly reflected by the front or rear surface of the substrate WF.

Each of the antireflection surfaces 1e, 2e, and 3e includes a surface having a lower reflectance against light emitted by the light-emitting element 120 than a predetermined reflectance (for example, 10%). It should be noted that it suffices that the surface having a lower reflectance than a predetermined reflectance is included at least in each of the antireflection surfaces 1e, 2e, and 3e of the plate parts 1, 2, and 3, respectively. For example, the surface having the lower reflectance may be included in all the surfaces of the plate parts 1, 2, and 3.

Considering that the orienter apparatus 100 including the antireflection member 10 is used in a vacuum state (see FIGS. 1 and 2), each of the antireflection surfaces 1e, 2e, and 3e can include a surface suitable for use in the vacuum state. For example, when light emitted by the light-emitting element 120 is infrared light, a surface plated with nickel for blackening and a surface applied with black paint respectively have a lower reflectance than a predetermined reflectance (for example, 10%) in an infrared region IRR, as illustrated in FIG. 7. Consequently, these surfaces are suitable as surfaces to be included in the antireflection surfaces 1e, 2e, and 3e. FIG. 7 is a diagram illustrating spectral reflection characteristics of materials. That is, when light emitted by the light-emitting element 120 is infrared light, each of the antireflection surfaces 1e, 2e, and 3e includes at least one of a surface plated with nickel for blackening and a surface applied with black paint.

The antireflection surfaces 1e, 2e, and 3e respectively including a surface plated with nickel for blackening can be formed by applying first nickel plating or second nickel plating for blackening to principal surfaces to become the antireflection surfaces 1e, 2e, and 3e of the plate parts 1, 2, and 3, respectively. For example, surfaces having undergone the first nickel plating for blackening can be formed by applying electroless nickel plating to the principal surfaces to become the antireflection surfaces 1e, 2e, and 3e of the plate parts 1, 2, and 3, using an alkaline electroless-nickel-plating liquid containing phosphinic acid and citric acid. Alternatively, for example, surfaces having undergone the second nickel plating for blackening can be formed by applying electroless nickel plating to the principal surfaces to become the antireflection surfaces 1e, 2e, and 3e of the plate parts 1, 2, and 3, using a plating liquid that is obtained by adding sulfur compounds having a thiol group and heavy metal-stabilizing agents to an alkaline electroless-nickel-plating liquid containing phosphinic acid and citric acid.

The antireflection surfaces 1e, 2e, and 3e respectively including a surface applied with black paint can be formed by applying the principal surfaces to become the antireflection surfaces 1e, 2e, and 3e of the plate parts 1, 2, and 3 with first black paint, second black paint, or third black paint by a spray or the like. The first black paint is mainly composed of black carbon. The second black paint differs from the first black paint and has a lower spectral reflectance in the infrared region IRR than that of the first black paint. The third black paint differs from the first black paint and the second black paint and has a lower spectral reflectance in the infrared region IRR than those of the first black paint and the second black paint.

It should be noted that, when light emitted by the light-emitting element 120 is infrared light, the reflectance of a surface treated with alumite is equal to or larger than a predetermined reflectance (for example, 10%) in the infrared region IRR. Accordingly, the surface treated with alumite is inappropriate as a surface to be included in the antireflection surface 1e, 2e, or 3e. Meanwhile, for example, when light emitted by the light-emitting element 120 is visible light, the reflectance of a surface treated with alumite is lower than a predetermined reflectance (for example, 10%) in a visible light region VLR. Accordingly, the surface treated with alumite is appropriate as a surface to be included in the antireflection surface 1e, 2e, or 3e. That is, when light emitted by the light-emitting element 120 is visible light, each of the antireflection surfaces 1e, 2e, and 3e includes at least one of a surface treated with alumite, a surface plated with nickel for blackening, and a surface applied with black paint. When the plate parts 1, 2, and 3 are formed of a material composed of aluminum as a main component, the antireflection surfaces 1e, 2e, and 3e respectively including a surface treated with alumite can be formed by applying alumite treatment (oxidation treatment) to the principal surfaces to become the antireflection surfaces 1e, 2e, and 3e of the plate parts 1, 2, and 3.

Figure 8:
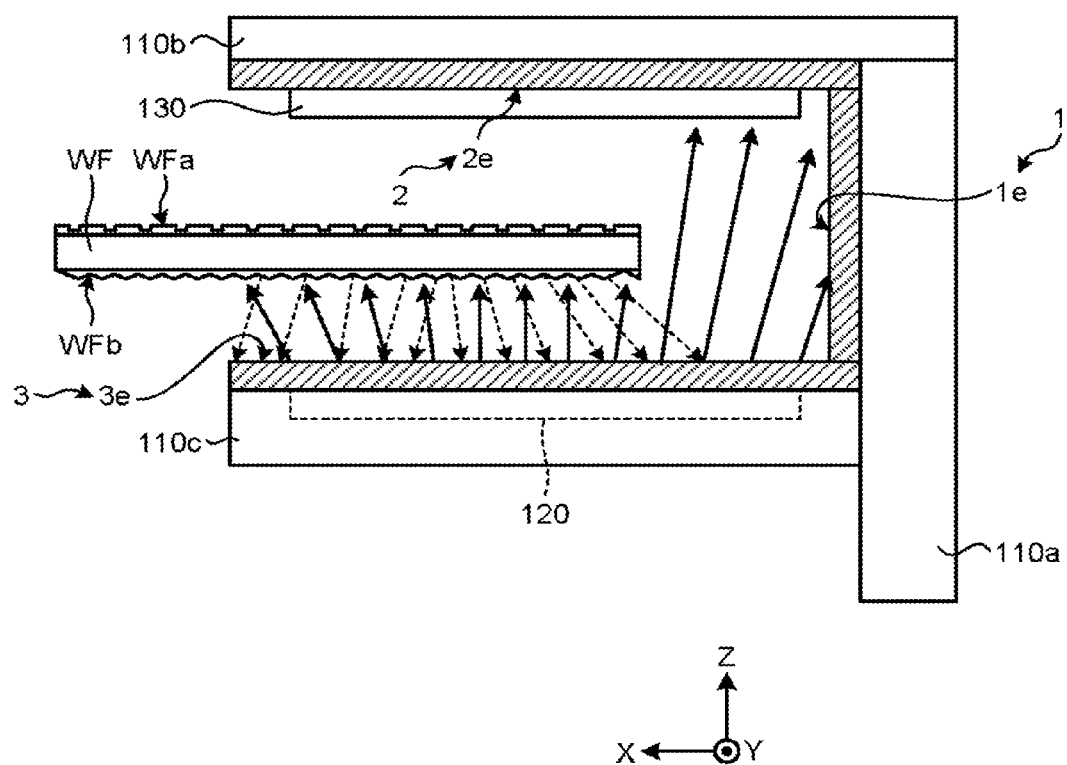
FIG. 8 is a side view illustrating a function of the antireflection member according to the embodiment.

In the orienter apparatus 100 including the antireflection member 10, when light emitted by the light-emitting element 120 is received by the light-receiving element 130 while the supporting mechanism 140 is rotating the substrate WF, the antireflection member 10 can prevent irregular reflection of the light, as illustrated in FIG. 8. FIG. 8 is a side view illustrating a function of the antireflection member 10. For example, when light emitted by the light-emitting element 120 is reflected by a rear surface WFb of the substrate WF, re-reflection of the reflected light can be suppressed by the antireflection surface 1e. When light that the antireflection surface 1e has failed to suppress enters the antireflection surface 2e or 3e, re-reflection of the light can be suppressed by the antireflection surface 2e or 3e. Further, when light that the antireflection surface 2e or 3e has failed to suppress is reflected by a front surface WFa of the substrate WF and enters the antireflection surface 2e or 3e again, re-reflection of the light can be suppressed by the antireflection surface 2e or 3e. Therefore, abrupt change in the received light quantity by the light-receiving element 130 due to irregular light reflection during the rotation of the substrate WF can be suppressed.

Figure 9:
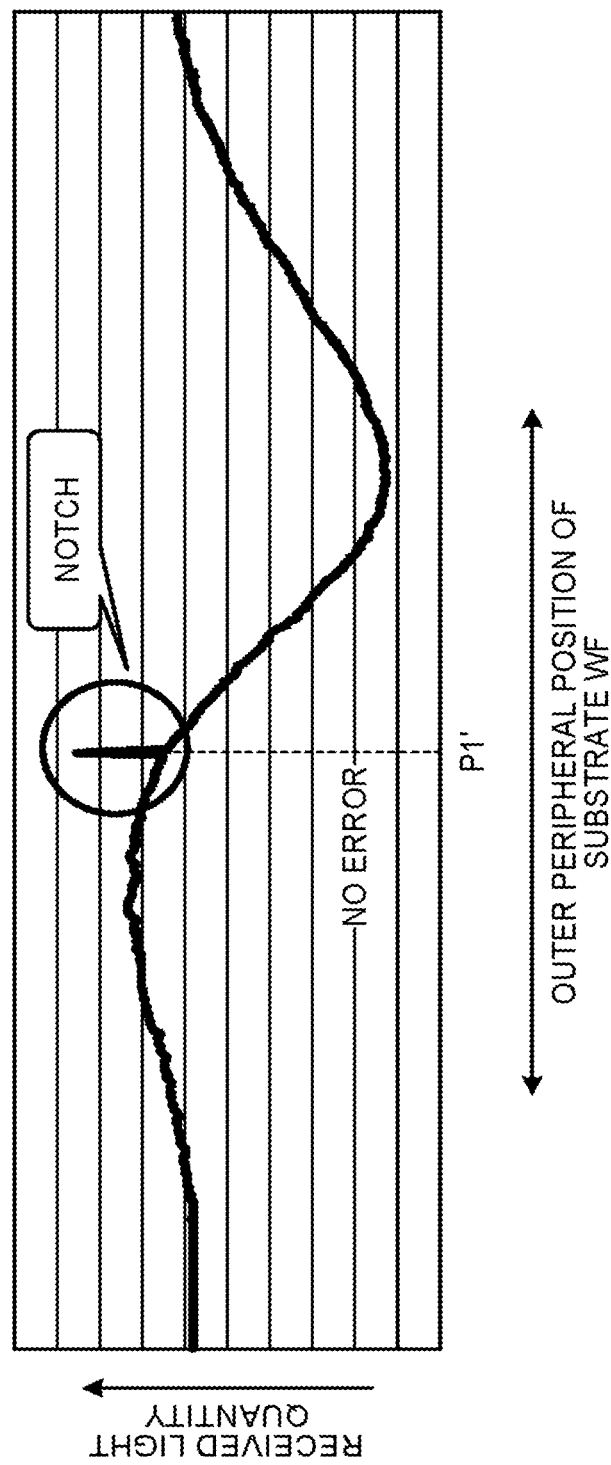
FIG. 9 is a waveform chart illustrating an operation of the orienter apparatus including the antireflection member according to the embodiment.

For example, as illustrated in FIG. 9, the controller 150 can obtain the outer peripheral position of the notch N of the substrate WE appropriately based on the quantity of light emitted by the light-emitting element 120 and received by the light-receiving element 130 while the supporting mechanism 140 is rotating the substrate WF. FIG. 9 is a waveform chart illustrating an operation of the orienter apparatus 100. For example, as illustrated in FIG. 9, the received light quantity abruptly changes at one position P1' in the outer peripheral position in one rotation of the substrate WF. The controller 150 can specify the outer peripheral position of the notch N as the position P1'. That is, occurrence of notch detection errors can be prevented.

It should be noted that the background-like waviness in the received light quantity by the light-receiving element 130 is illustrated in FIG. 9. This waviness is caused by the influence of the slight deviation of the placement position of the substrate WF on the pad 141 from the center of the substrate WF, as illustrated in FIG. 3B. Even in this case, the controller 150 can determine the position P1' at which the received light quantity abruptly changes as the outer peripheral position of the notch N.

As described above, in the present embodiment, the antireflection member 10 is arranged in the region including the vicinity of the light-emitting element 120 and the vicinity of the light-receiving element 130 in the apparatus body 110 in the orienter apparatus 100. Accordingly, abrupt change in the received light quantity by the light-receiving element 130 due to irregular light reflection during the rotation of the substrate WE can be suppressed and the light-receiving element 130 is allowed to receive light emitted by the light-emitting element 120 appropriately. As a result, noise components due to irregular light reflection can be reduced in the received light quantity by the light-receiving element 130 and occurrence of notch detection errors can be suppressed while cost of the orienter apparatus 100 can be suppressed without greatly changing the configuration of the apparatus body 110.

In the present embodiment, in the antireflection member 10, the plate part 2 to be arranged in the vicinity of the light-emitting element 120 and the plate part 3 to be arranged in the vicinity of the light-receiving element 130 have the antireflection surfaces 2e and 3e opposed to each other, respectively. The plate part 1 has the antireflection surface 1e directed to the plate parts 2 and 3. The notch parts 2f and 3f are arranged in the plate parts 2 and 3 so as to correspond to the positions of the light-emitting element 120 and the light-receiving element 130, respectively. Accordingly, the antireflection member 10 does not shield light emitted by the light-emitting element 120 to be received by the light-receiving element 130. Therefore, it is possible to provide the antireflection member 10 that is suitable to cause the light-receiving element 130 to receive appropriately light emitted by the light-emitting element 120 in the orienter apparatus 100.

It should be noted that, although FIGS. 1 and 2 exemplify a case where the orienter apparatus 100 is applied to the ion implanting apparatus 200, the orienter apparatus 100 may be applied to other apparatuses configured to adjust the orientation of the substrate WF.

Figure 10:
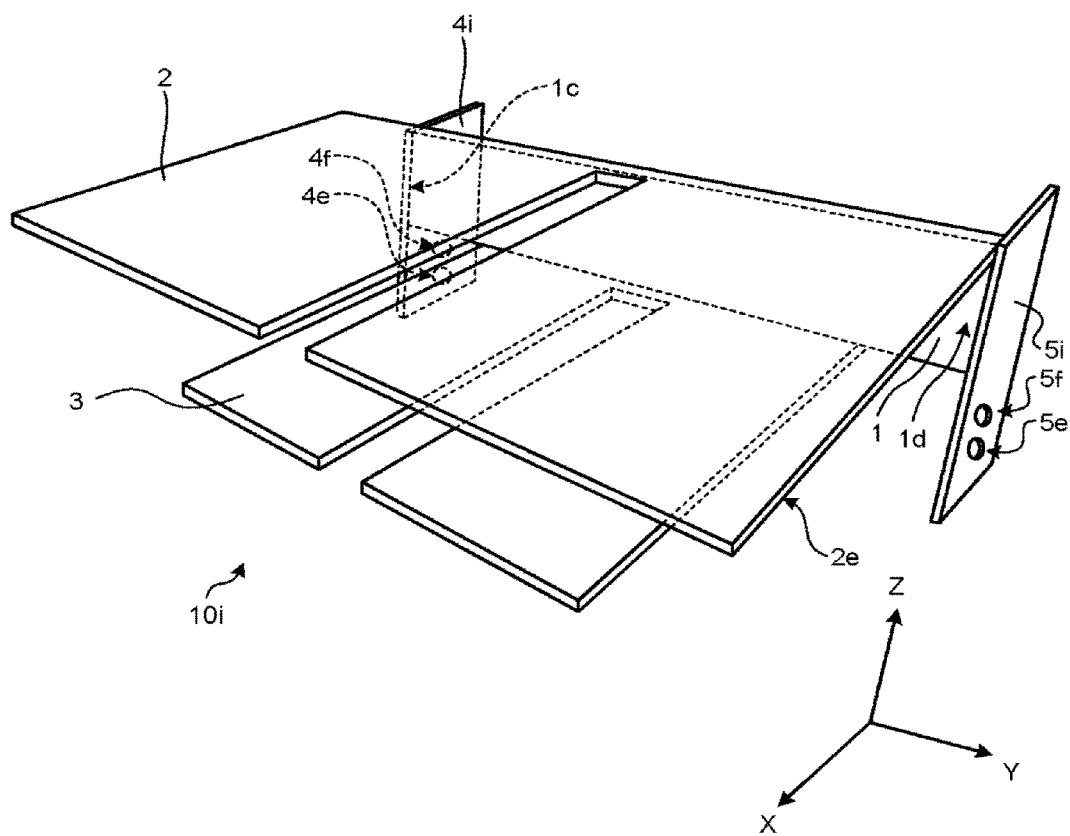
FIG. 10 is a perspective view illustrating a configuration of an antireflection member according to a modification of the embodiment.

FIGS. 10 to 13 illustrate the configurations of antireflection members according to modifications of the embodiment. As illustrated in FIG. 10, an antireflection member 10i may be fixed to the apparatus body 110 via a screw instead of an adhesive. FIG. 10 is a perspective view illustrating the configuration of the antireflection member 10i. For example, the antireflection member 10i further includes plate parts 4i and 5i. The plate part 4i extends from the end 1c of the plate part 1 in the −X direction in a plate shape and extends from the end 1c of the plate part 1 to a side opposite to the plate parts 2 and 3. The plate part 4i has a shape such that the Z direction is its longitudinal direction. The plate part 4i has screw holes 4e and 4f corresponding to screw holes of the apparatus body 110. Similarly, the plate part 5i extends from the end 1d of the plate part 1 in the −X direction in a plate shape and extends from the end 1d of the plate part 1 to a side opposite to the plate parts 2 and 3. The plate part 5i has a shape such that the Z direction is its longitudinal direction. The plate part 5i has screw holes 5e and 5f corresponding to screw holes 110e and 110f (see FIG. 3A) of the apparatus body 110, respectively. This configuration allows the antireflection member 10i to be fixed to via screws or removed from the apparatus body 110. Consequently, the maintenance or replacement of the antireflection member 10i can be performed easily.

Figure 11:
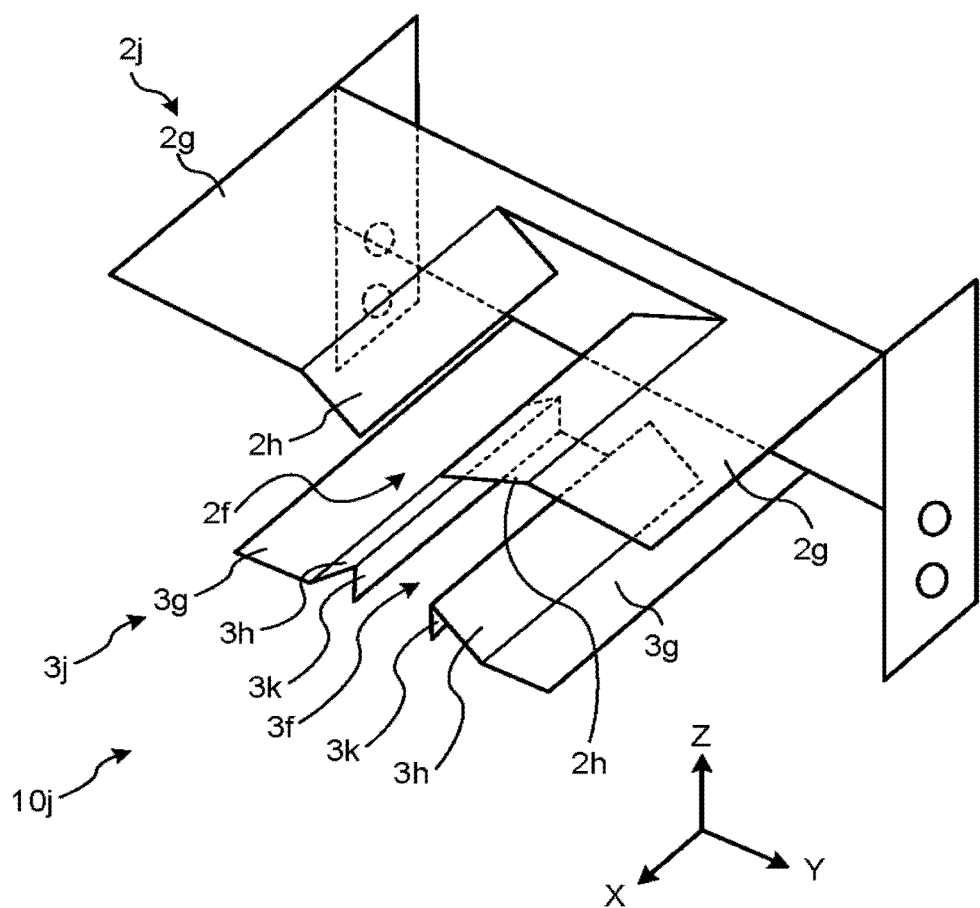
FIG. 11 is a perspective view illustrating a configuration of an antireflection member according to another modification of the embodiment.

Alternatively, as illustrated in FIG. 11, an antireflection member 10j may further has a shape with angles relative to the light-emitting element 120 and the light-receiving element 130. FIG. 11 is a perspective view illustrating a configuration of the antireflection member 10j.

For example, in a plate part 2j, the notch part 2f is arranged closer to a plate part 3j than principal parts 2g of the plate part 2j (see FIG. 12). The plate part 2j further includes inclined parts 2h. The inclined parts 2h are inclined in respective directions from the principal parts 2g toward the plate part 3j and extend to the notch part 2f. Consequently, oblique light due to irregular reflection that is indicated by broken-line arrows in FIG. 12, among light that advances toward the light-receiving element 130, can be suppressed from being received by the light-receiving element 130. Therefore, appropriate light that is indicated by solid-line arrows in FIG. 12 can be selectively received by the light-receiving element 130. FIG. 12 is a front view illustrating a function of the antireflection member 10j. As a result, noise components due to irregular light reflection can be further reduced in the received light quantity by the light-receiving element 130.

In the plate part 3j, the notch part 3f is arranged closer to the plate part 2j than principal parts 3g of the plate part 3j (see FIG. 13). The plate part 3j further includes inclined parts 3h and folded-back parts 3k. The inclined parts 3h are inclined in respective directions from the principal parts 3g toward the plate part 2j and extend to the notch part 3f. The folded-back parts 3k are folded at the respective ends of the inclined parts 3h at the notch part 3f side toward the side opposite to the plate part 2j. Consequently, oblique light that is indicated by broken-line arrows in FIG. 13 and easily becomes a factor of irregular reflection, among light that is emitted by the light-emitting element 120, can be suppressed from being emitted by the light-emitting element 120. Therefore, appropriate light that is indicated by solid-line arrows in FIG. 13 can be selectively emitted by the light-emitting element 120. FIG. 13 is a front view illustrating a function of the antireflection member 10j. As a result, noise components due to irregular light reflection can be further reduced in the received light quantity by the light-receiving element 130.

Alternatively, although FIG. 11 illustrates a case where the antireflection member 10j has a shape with angles in the vicinities of both the light-emitting element 120 and the light-receiving element 130, the antireflection member 10j may have a shape with an angle in the vicinity of either the light-emitting element 120 or the light-receiving element 130. Even when the antireflection member 10j has such a shape, noise components due to irregular light reflection can be further reduced in the received light quantity by the light-receiving element 130, compared with a case where each of the plate parts 2 and 3 has a flat plate shape as a whole.

In the above embodiment, there has been described an example in which the light-emitting element 120 and the light-receiving element 130 are arranged in the apparatus body 110 so as to cause the detection light of the notch N to advance along the +Z direction. However, the position of the light-emitting element 120 and the position of the light-receiving element 130 may be interchanged in the apparatus body 110 so as to cause the detection light of the notch N to advance along the −Z direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An antireflection member comprising:
   a first plate part that has a first end and a second end, the second end being arranged at a side opposite to the first end;
   a second plate part that extends from a vicinity of the first end, a first notch part being arranged on the second plate part, the second plate part having an antireflection surface; and a third plate part that extends from a vicinity of the second end to be opposed to the second plate part, a second notch part being arranged at a position corresponding to the first notch part on the third plate part, the third plate part having an antireflection surface directed to the antireflection surface of the second plate part.

2. The antireflection member according to claim 1, wherein
the first plate part has an antireflection surface directed to the second plate part and the third plate part.

3. The antireflection member according to claim 1, wherein
the antireflection surface of the second plate part and the antireflection surface of the third plate part respectively include at least one of a surface treated with alumite, a surface plated with nickel for blackening, and a surface applied with black paint.

4. The antireflection member according to claim 3, wherein
the black paint includes black carbon as a main component.

5. The antireflection member according to claim 2, wherein
the antireflection surface of the first plate includes at least one of a surface treated with alumite, a surface plated with nickel for blackening, and a surface applied with black paint.

6. The antireflection member according to claim 5, wherein
the black paint includes black carbon as a main component.

7. The antireflection member according to claim 1, wherein
the first notch part extends from an end of the second plate part at a side opposite to the first plate part to approach the first plate part, and
the second notch part extends from an end of the third plate part at a side opposite to the first plate part to approach the first plate part.

8. The antireflection member according to claim 1, wherein
the first notch part is arranged closer to the third plate part than a first principal part of the second plate part, and
the second plate part further has a first inclined part that is inclined in a direction from the first principal part toward the third plate part and extends to the first notch part.

9. The antireflection member according to claim 1, wherein
the second notch part is arranged closer to the second plate part than a second principal part of the third plate part, and
the third plate part further has a second inclined part that is inclined in a direction from the second principal part toward the second plate part and extends to the second notch part.

10. The antireflection member according to claim 9, wherein
the third plate part further has a folded-back part that is folded back at an end of the second inclined part at a side of the second notch part toward a side opposite to the second plate part.

11. The antireflection member according to claim 1, wherein
the first plate part further includes
a third end that is arranged between the first end and the second end and a fourth end that is arranged between the first end and the second end at a side opposite to the third end, and
the member further comprises
a fourth plate part that extends from the third end to a side opposite to the second plate part and the third plate part, a screw hole being arranged on the fourth plate part, and
a fifth plate part that extends from the fourth end to the side opposite to the second plate part and the third plate part, a screw hole being arranged on the fifth plate part.

12. An orienter apparatus comprising:
an apparatus body;
a light-emitting element that is fixed to the apparatus body;
a light-receiving element that is fixed at a position opposed to the light-emitting element in the apparatus body;
a supporting mechanism that supports a substrate rotatably while an end of the substrate is positioned between the light-emitting element and the light-receiving element; and
an antireflection member that is arranged in a region including a vicinity of the light-emitting element and a vicinity of the light-receiving element in the apparatus body, the antireflection member including a first plate part, a second plate part, a third plate part, the first plate part having a first end and a second end, the second end being arranged at a side opposite to the first end, the second plate part extending from a vicinity of the first end, a first notch part being arranged on the second plate part to correspond to the light-receiving element, the second plate part having an antireflection surface, the third plate part extending from a vicinity of the second end to be opposed to the second plate part, a second notch part being arranged on the third plate part to correspond to the light-emitting element, the third plate part having an antireflection surface directed to the antireflection surface of the second plate part.

13. The orienter apparatus according to claim 12, further comprising a controller that obtains an outer peripheral position of a notch of the substrate based on a quantity of light emitted by the light-emitting element and received by the light-receiving element while the supporting mechanism is rotating with the substrate.

14. The orienter apparatus according to claim 12, wherein
the antireflection member is configured to be attachable to and detachable from the apparatus body.

15. The orienter apparatus according to claim 14, wherein
the apparatus body and the antireflection member are configured to be fixed to each other via a screw by using a screw hole provided on the apparatus body and a screw hole provided on the antireflection member.

16. The orienter apparatus according to claim 12, wherein
the third plate part of the antireflection member is arranged in the vicinity of the light-emitting element in the apparatus body,
the second plate part of the antireflection member is arranged in the vicinity of the light-receiving element in the apparatus body, and
the first plate part of the antireflection member has an antireflection surface directed to the light-emitting element and the light-receiving element.

17. The orienter apparatus according to claim 12, wherein
the antireflection surface of the second plate part and the antireflection surface of the third plate part in the antireflection member respectively include at least one of a surface treated with alumite, a surface plated with nickel for blackening, and a surface applied with black paint.

18. The orienter apparatus according to claim 16, wherein the antireflection surface of the first plate in the antireflection member includes at least one of a surface treated with alumite, a surface plated with nickel for blackening, and a surface applied with black paint.

19. The orienter apparatus according to claim 12, wherein the apparatus body includes a first part, a second part that extends from a first region in the first part, and a third part that extends from a second region located lower than the first region in the first part to be opposed to the second part, the light-receiving element is arranged on a lower surface of the second part, and the light-emitting element is arranged on an upper surface of the third part.

20. The orienter apparatus according to claim 19, wherein the first plate part of the antireflection member is arranged in a vicinity of a third region between the first region and the second region in the first part of the apparatus body, the second plate part of the antireflection member is arranged in a vicinity of the light-receiving element on the lower surface of the second part of the apparatus body, and the third plate part of the antireflection member is arranged in a vicinity of the light-emitting element on the upper surface of the third part of the apparatus body.

* * * * *